United States Patent [19]
Kantorowicz

[11] Patent Number: 4,914,613
[45] Date of Patent: Apr. 3, 1990

[54] FREQUENCY SYNTHESIS METHOD AND A SYNTHESIZER APPARATUS USING THIS METHOD

[75] Inventor: Gérard Kantorowicz, Paris, France

[73] Assignee: Thomson-CSF, Paris, France

[21] Appl. No.: 922,301

[22] Filed: Oct. 21, 1986

[30] Foreign Application Priority Data

Oct. 22, 1985 [FR] France .................. 85 15662

[51] Int. Cl.$^4$ .............................. G06F 1/02
[52] U.S. Cl. ................................. 364/721
[58] Field of Search ................ 364/718, 721

[56] References Cited

U.S. PATENT DOCUMENTS

| 4,159,526 | 6/1979 | Mosley, Jr. et al. | 364/721 |
| 4,285,044 | 8/1981 | Thomas et al. | 364/721 |
| 4,577,287 | 3/1986 | Chrin | 364/721 |
| 4,618,966 | 10/1986 | Stepp et al. | 364/721 |

FOREIGN PATENT DOCUMENTS

7204807 10/1973 Netherlands .
331077 8/1958 Switzerland .

OTHER PUBLICATIONS

V. K. Bhargava et al., p. 69, J. Wiley, New York, 1981 "Digital Communications".

Primary Examiner—Gary V. Harkcom
Assistant Examiner—Long T. Nguyen
Attorney, Agent, or Firm—Cushman, Darby & Cushman

[57] ABSTRACT

A synthesizer apparatus is provided allowing very high speed switching while keeping phase continuity. It includes a plurality of cells, each with four mixers, a subtractor and an adder for obtaining at the output two in quadrature signals, of jump frequency $\mp n\, F_r$, n being an integer, from in quadrature signals of a basic frequency $F_r$. These signals are then multiplied in a terminal circuit with two in quadrature signals relative to a carrier frequency Fc then added so as to produce the signal transposed to the frequency $F_c \mp n\, F_r$ desired for use.

7 Claims, 5 Drawing Sheets

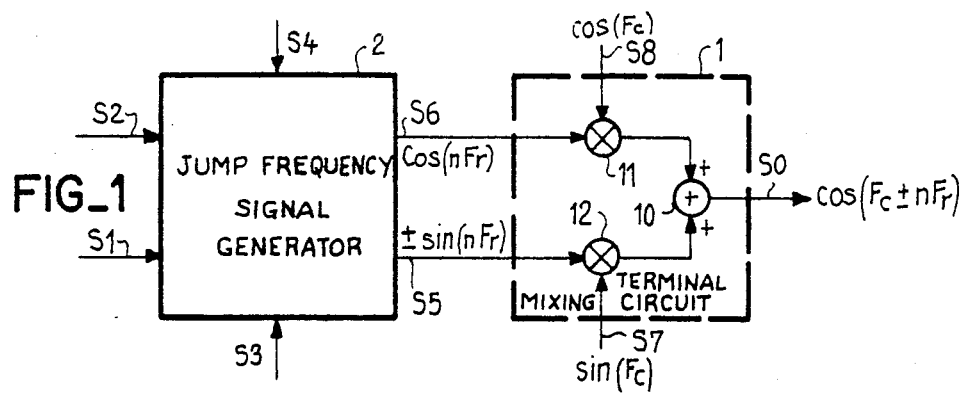
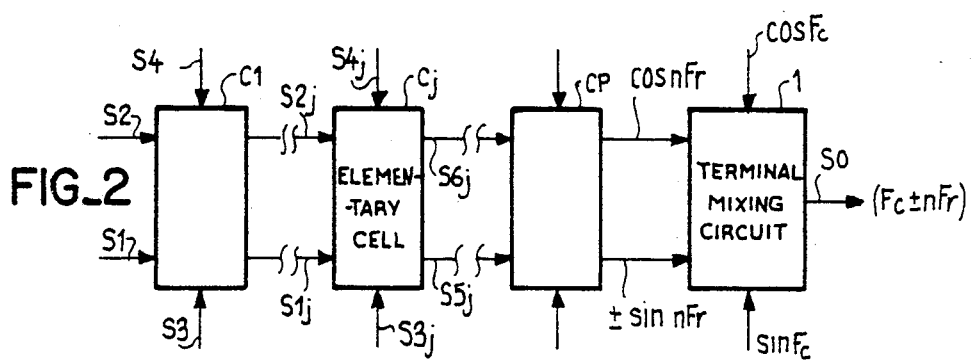
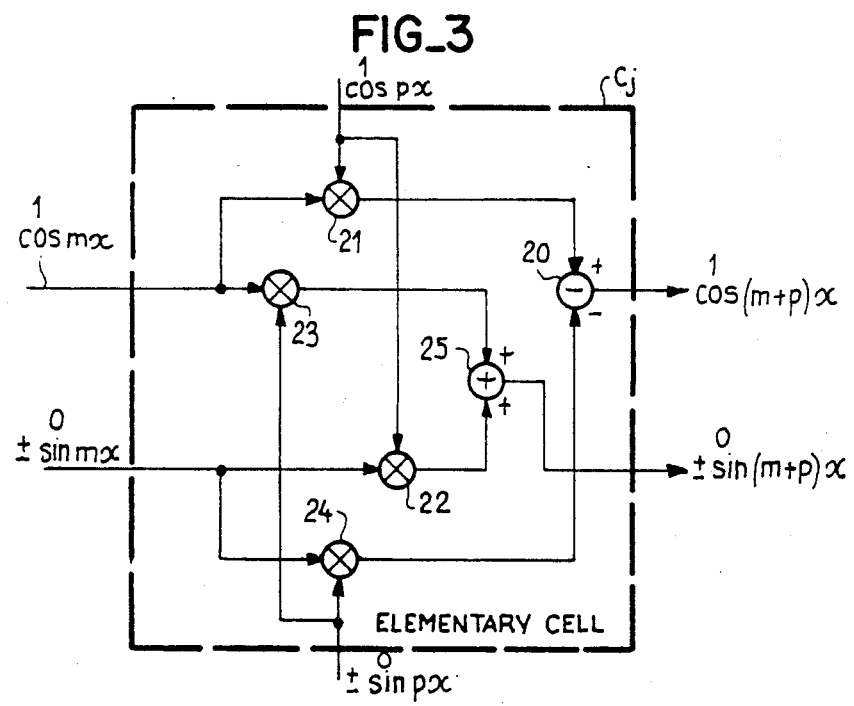

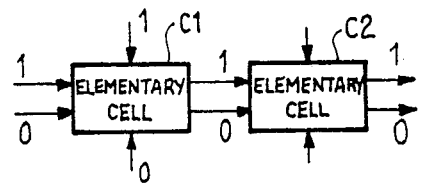
FIG_4-A
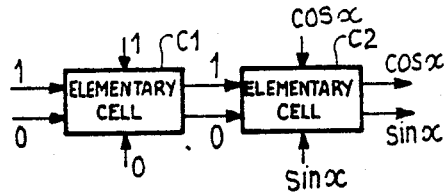
FIG_4-B
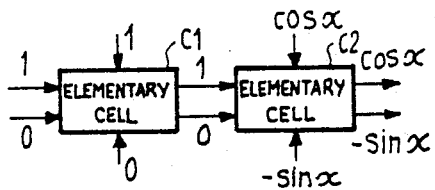
FIG_4-E
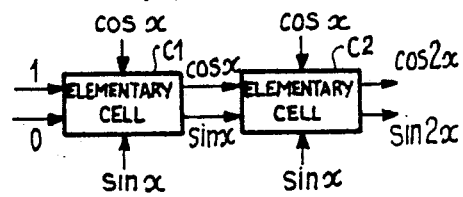
FIG_4-C
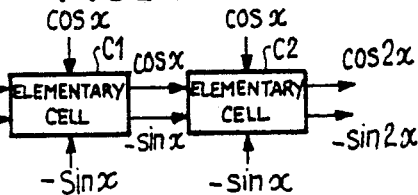
FIG_4-F
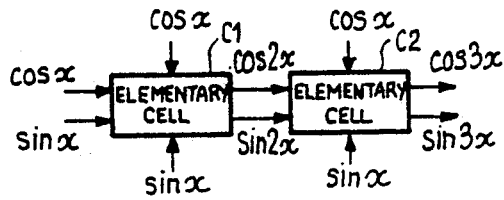
FIG_4-D
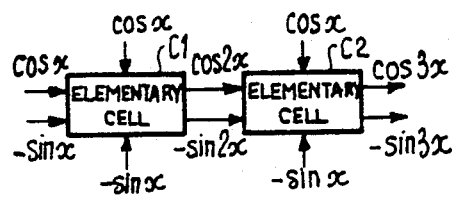
FIG_4-G
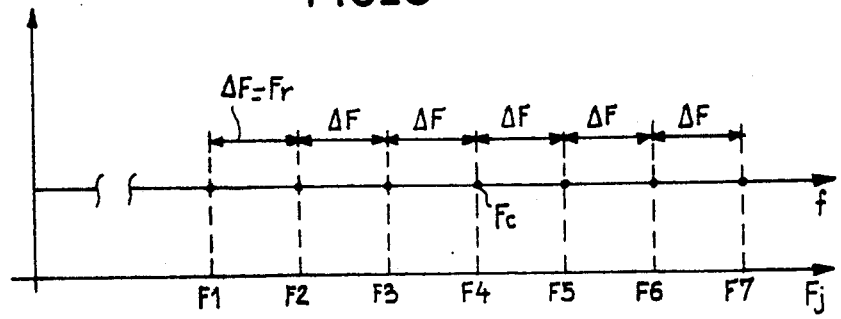
FIG_5

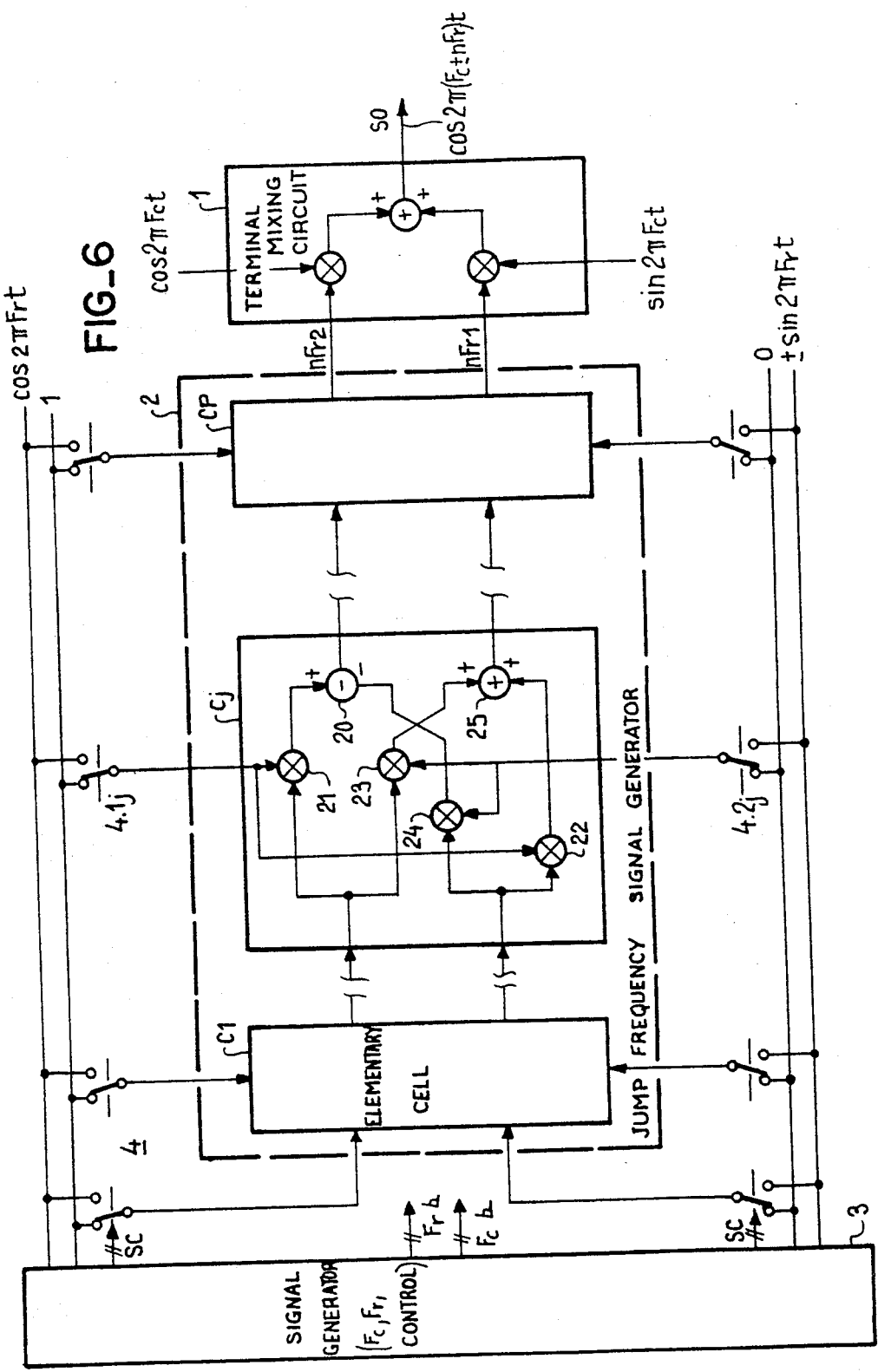
FIG_6

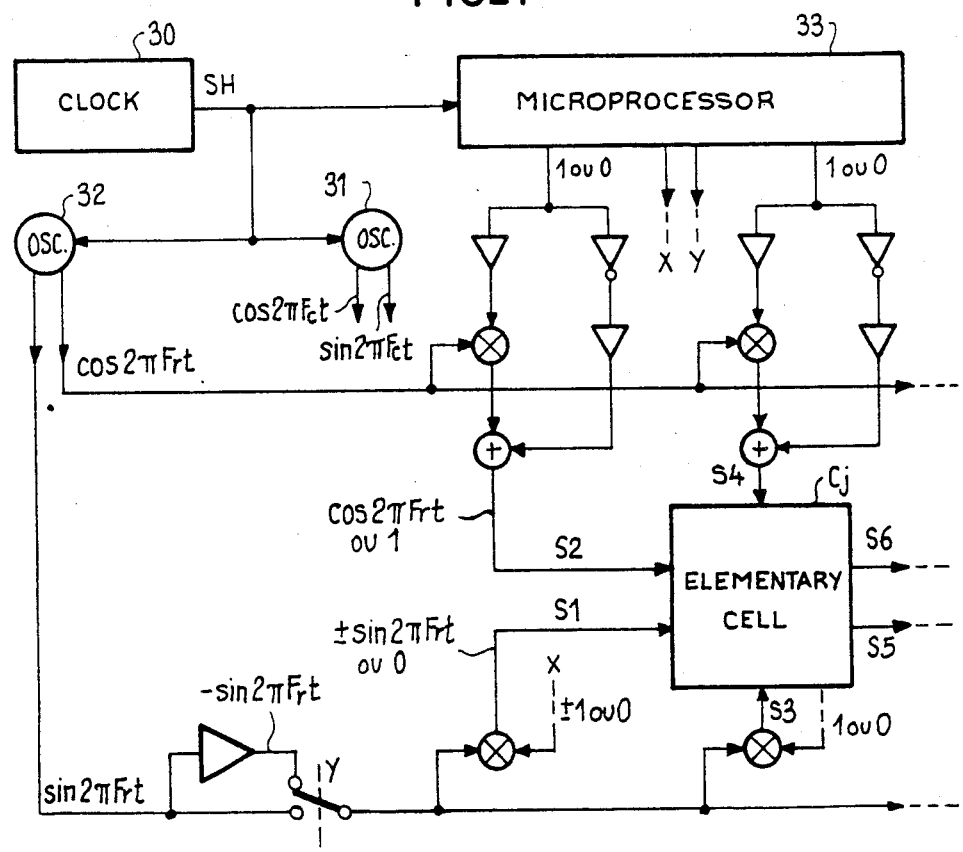
FIG_7
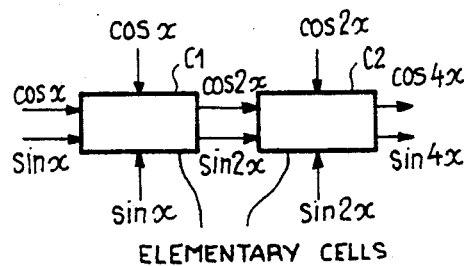
FIG_8-A
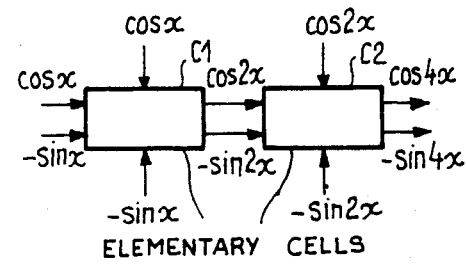
FIG_8-B

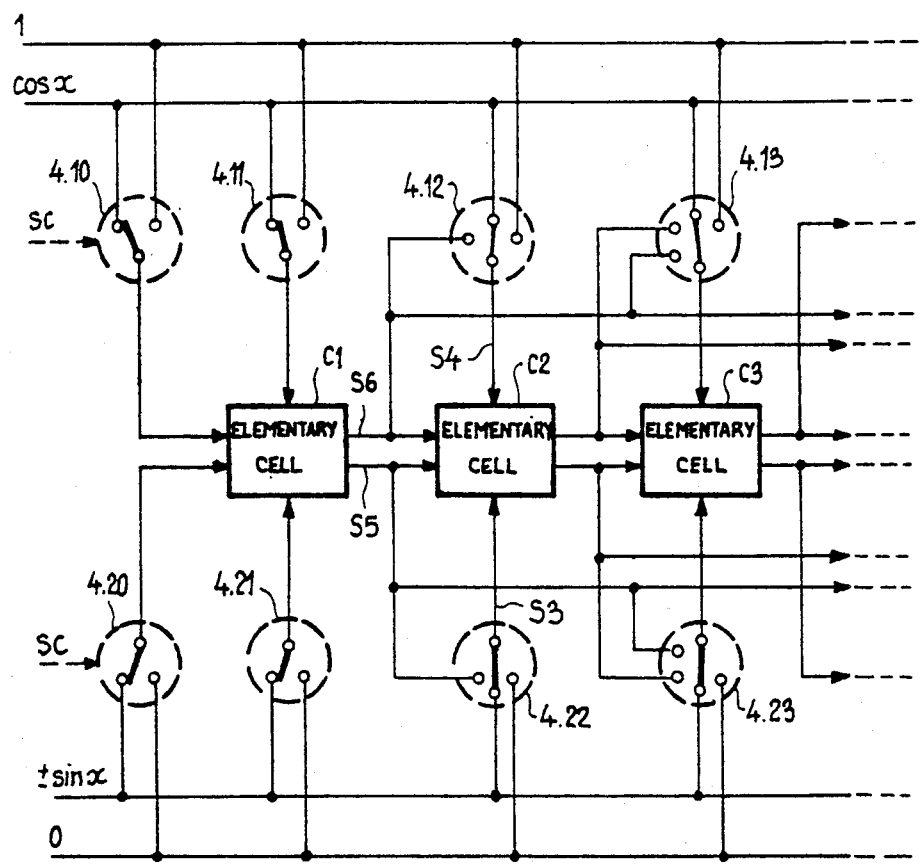
FIG_9

FREQUENCY SYNTHESIS METHOD AND A SYNTHESIZER APPARATUS USING THIS METHOD

BACKGROUND OF THE INVENTION

1. Field of the Invention

The present invention relates to a frequency synthesis method as well as the apparatus using this method.

2. Description of the Prior Art

Some transmission systems, in particular those designed to withstand jamming, require very rapid frequency jumps of the carrier, with a known phase so that a coherent demodulation may be provided on reception.

Frequency synthesizers are generators capable of selecting on request a given band from a plurality of available bands of the spectrum.

The output frequency is generally obtained by slaving an oscillator by means of a phase loop to a reference frequency. Frequency switching in the most rapid synthesizers known for frequencies higher than a few MHz, of the phase loop type, requires a minimum time of several microseconds depending in particular on the pass band of the phase loop.

The frequency bands of the spectrum generally result from mixtures, multiplications and divisions of several reference frequencies, and these operations, in particular the digital frequency division, do not allow a phase continuity of the new frequency to be ensured with respect to the old one.

In yet another technique, a frequency comb is produced then the desired spectral band is selected by switching the outputs of a bank of frequency filters. These acoustic surface wave based filters have a not inconsiderable propagation delay, of the order of 1 to 3 microseconds, and counter-balancing the delay time, so the phase shift, forms the limit of this type of synthesizer.

The invention aims at overcoming the insufficiencies and limitations of the above mentioned techniques by providing a synthesizer better able to comply with the high speed switching requirements and continuity of the phase of the signal.

SUMMARY OF THE INVENTION

There is known, among others, from the document "Digital communications by satellite" by V. K. BHARGAVA et al page 69, J. WILEY, New York, 1981, a binary modulator of a carrier frequency having two in phase and quadrature channels for providing a frequency jump with continuity of the phase (technique called CPFSK the abbreviation of Continuous Phase Frequency Shift Keying). The two binary states are thus translated by two frequencies. The means used consist of a first pair of mixers for providing signals respectively in quadrature on each channel with a desired sign and relative to a jump frequency $F_r$, and a second pair of mixers for multiplying these jump signals with in quadrature signals corresponding to a carrier frequency $F_c$, the outputs then being added so as to obtain the final signal corresponding to the frequency $F_c + F_r$, or to the frequency $F_c - F_r$, depending on the binary state 0 or 1 it is desired to transmit. The continuity of the phase is provided as long as the change of sign of the jump signals takes place at times when the phase of the output signal is equal to "0" or "$\pi$". This result is obtained using known techniques, by producing for example the signals at the jump frequency $F_r$ and at that of the carrier $F_c$ from a common clock which also synchronizes all the other control signals and those used for the sign changes.

OBJECT OF THE INVENTION

An object of the invention is to use this basic technique and to modify it and adapt it so as to obtain a frequency synthesizer complying with the technical requirements mentioned above.

BRIEF DESCRIPTION OF THE DRAWINGS

The characteristics of the solution proposed and used in the present invention for attaining the desired aims as well as its advantages will be clear from the following description given by way of example, with reference to the accompanying Figures which show:

FIG. 1 is a general simplified diagram of a synthesizer in accordance with the invention;

FIG. 2, a general diagram of a synthesizer according to the invention;

FIG. 3, a diagram of the basic module or cell used for producing the in quadrature signals relative to the jump frequency;

FIGS. 4A 4B, 4C, 4D, 4E, 4F, 4G, different possible cases of operation of an assembly of two cells in accordance with the diagram of FIG. 3;

FIG. 5, a diagram of the carrier frequencies obtained with a circuit of FIG. 4;

FIG. 6, a diagram of one embodiment of a synthesizer apparatus in accordance with the invention;

FIG. 7, a diagram of a detail relative to a possible arrangement of the associated jump and carrier signal generators and of the switching and sign signal generators;

FIGS. 8A to 8B, two additional cases of operation of an assembly of two cells; and FIG. 9, a diagram of a variant of construction of the synthesizer apparatus as shown in FIG. 6 for producing additional cases of operation, of the type shown in FIGS. 8A and 8B.

DESCRIPTION OF THE PREFERRED EMBODIMENTS

Referring to FIG. 1, a frequency jump generator according to the invention has a terminal circuit 1 with two multiplication elements 11 and 12 and an summing circuit 10. The multiplication elements may be formed for example by balanced mixers, but this form of construction is not limitative. These elements will be designated hereafter by the term "mixer". The signal as applied to the two mixers include two signals in phase quadrature of the same carrier frequency. For the sake of simplification, the signal corresponding to the sine of this carrier frequency ($\sin 2\pi F_c t$), will be designated by $\sin F_c$, and $\cos F_c$ will designate the signal corresponding to the cosine of this carrier frequency ($\cos 2\pi F_c t$), it of course being understood that the amplitudes of the sinusoidal waves are considered to have a unity value. It should also be understood that the two mixers 11 and 12 are balanced mixers, that is to say that each one delivers no signal other than the product of the two signals applied, and that they are perfectly identical in amplitude and phase. The two carrier signals are multiplied respectively with two signals S5, S6 which are also in quadrature relative to a jump frequency to be provided. The outputs of the mixers are added in the summary circuit 10 so as to provide an output signal whose frquency is equal to the central frequency $F_c$ adjusted by the jump value, which can be positive or negative, depending on the sign presented by the jump frequency signals.

In the simple case of the known technique of the above mentioned binary modulator, the in-quadrature jump signals are obtained by a generator circuit 2 formed simply by a second pair of balanced mixers receiving at a first mixer the signals S1 and S3 indicated and at a second mixer the signals S2 and S4 indicated. The signals S1 and S2 are sign signals, and they have a value +1 depending on whether it is desired to assign a positive or a negative value to the corresponding values S3 and S4. The signals S3 and S4 correspond respectively to the cosine of a jump frequency $F_r$ and to the sine of the same jump frequency $F_r$. The corresponding outputs S5 and S6 are multiplied by the carrier frequency signals in the mixers 11 and 12. Thus two output frequency values $F_c \mp F_r$ are finally produced, namely a jump of value $2F_r$ for the contemplated use as binary modulator.

According to the invention, the generator of in quadrature jump signals 2 is organized differently, formed of a plurality of cells C1 to CP with inputs such as S1, S2, S3 and S4, but with different signals so as to output a jump frequency equal to or a multiple of a basic frequency $F_r$ indicated in the form $nF_r$, where "n" can to have the value "1" or any higher value, in the case of a harmonic. As before, these signals have been indicated by sin $nF_r$ and cos $nF_r$ for the sake of simplicity. The value corresponding to the sine bears the sign $\mp 1$ taking into account the sign $\mp$ which it is desired to assign to the frequency jump $nF_r$ at the output (the value corresponding to the cosine does not bear a sign since it is a question of an even function).

Referring to FIG. 2, the organization of the jump frequency signal generator in the form of a plurality of cells C1 to CP is shown in detail. A representative one of these cells, Cj, is shown in the following FIG. 3 cell Cj includes two pairs of balanced mixers, 21 and 22 on the one hand, 23 and 24 on the other and two summary circuits 20 and 25, one connected as a subtractor, and the other as an adder. Each cell has two pairs of inputs, a first pair S1j and S2j and a second pair S3j and S4j. The two inputs S1j and S2j correspond to the reception of a first pair of in-quadrature jump signals designated by $\mp\sin m\,x$ and $\cos m\,x$ (with $x=2\pi F_r t$); these signals represent then generally one of the harmonics of the frequency $F_r$, that of rank "m" when this parameter which is an integer has a value greater than 1; the case m=1 is also provided for and the signals correspond then to the basic frequency $F_r$. The signals S3j and S4j correspond to a second pair of jump signals in phase quadrature which is designated by $\mp\sin p\,x$ and $\cos p x$ respectively, also considering that the parameter "p" is equal to or greater than 1. In the examples of operation described hereafter "m" is taken as equal to or greater than "p" but this is not an obligation. The processing by multiplying and adding the signals S1j and S2j which correspond to sines and of the signals S2j and S4j which correspond to cosines delivers at the output a pair of signals S5j and S6j which are jump signals in phase quadrature but whose frequency is equal to the harmonic of rank "m∓p" (the negative sign is obtained for the negative values of S1j and S3j, -sin mx and -sin px) of the basic frequency $F_r$. This operation is repeated if required in a following cell and so on until there is obtained at the input of the terminal circuit 1 a pair of jump signals with the desired frequency value $nF_r$ for the frequency jump.

The function fulfilled by the basic cell corresponds to the application of two trigonometric relationships:

$$(\cos mx \cos px) - (\sin mx \sin px) = \cos(m+p)x \mp (\cos mx \sin px + \sin mx \cos px) = \mp\sin(m+p)x.$$

All the channels must be perfectly balanced. Imperfections in balancing risk causing parasitic mixtures to appear whose level may be estimated at −40 db with respect to the useful signal with mixers and adders having good performances. Parasitic bands of the lower level may be obtained after longer and more costly adjustments, or else by constructing the circuit in the form of an integrated circuit.

The synthesizer is obtained by connecting several basic cells Cj in cascade, as shown in FIG. 2. The inputs S1 and S2 form the outputs of the preceding cells $C_{j-1}$ and the outputs S5 and S6 form the inputs of the following cell $C_{j+1}$.

In a simple embodiment shown schematically in FIG. 6, the associated circuits 3 produce the basic signals which are the two carrier signals $\cos F_c$ and $\sin F_c$, the two basic jump frequency signals $\cos F_r$ and $\sin F_r$ as well as two other signals which correspond to the values "1" and "0". The signals $\cos F_c$ and $\sin F_c$ are applied in the terminal circuit 1 to the mixers 11 and 12 respectively. The signals corresponding to $\cos F_r$ and to the value "1" may be switched and applied to the inputs S2j and S4j of the different cells. The other two values corresponding to $\sin F_r$ and to the values "0" are intended for the inputs S1j and S3j of the cells.

FIG. 4 shows the operation with two cells C1 and C2 for obtaining seven different combinations to which correspond seven frequencies equidistant from a single basic frequency $F_r$ for the jumps.

FIG. 5 shows the distribution of these seven frequencies F1 to F7, the frequency F4 corresponding to the carrier frequency $F_c$ and the frequency difference between one value and the next being equal to $F_r$. FIG. 4a corresponds to obtaining the frequency $F_c$, FIGS. 4b and 4e to obtaining frequencies $F_c \mp F_r$, FIGS. 4c and 4f to obtaining $F_c \mp 2F_r$ and finally FIGS. 4d and 4g to obtaining $F_c \mp 3F_r$. It may be noted, considering these Figures, that with a single cell five different values are obtained, those corresponding to the outputs of FIGS. 4a, 4b, 4c, 4e, 4f; with the addition of a second cell C2 there may be further obtained the two additional configurations of output signals shown in FIGS. 4d and 4g. Generally, with the simple values $\mp\sin x$ and $\cos x$ envisaged for the input signals S3j and S4j, for n cells 3+2n different combinations are obtained and as many different frequency values at the output. It goes without saying that, if the device is designed with harmonic values of the kind $\mp\sin px$ and $\cos px$ contemplated in FIG. 3 at the lateral inputs S3j and S4j, the number of combinations may be further increased but this may lead a priori to a more complex construction of the apparatus.

FIG. 6 shows a simple arrangement of the whole circuit, with an associated signal generator circuit 3 comprising frequencies $F_r$ and $F_c$ as well as the signals "0" and "1" and signals for controlling the whole of the switching circuits for switching the input signals of the cells between two values.

FIG. 7 shows by way of non limitative example one possible embodiment of the associated circuits 3 and of the switching arrangements. The signal generator circuits 3 have a time base 30 which synchronizes, by means of a clock signal SH, two controlled oscillators, one oscillator 31 which delivers the in-quadrature signals corresponding to the carrier frequency, and a second oscillator 32 which delivers the in-quadrature signals corresponding to the basic jump frequency $F_r$. This clock is further connected to a switching control signal generator block which may be conveniently formed by a microprocessor 33 which delivers to logic switching circuits signals "1" or "0" for obtaining the desired signals at the inputs S1, S2, S3 and S4 of the cells. The "1" and "0" switching control are elaborated at times corresponding to the phase values 0 and $\pi$ of the signals. The frequency of the clock signal SH is a multiple of the other two values $F_r$ and $F_c$.

FIGS. 8A and 8B show two other circuits with two cells in which additional frequencies are obtained by taking for the lateral inputs harmonic signals of the basic frequency $F_r$. These solutions are possible more especially by producing additional switching by connecting the output of a basic cell simultaneously to two inputs of the next cell as shown in FIG. 9. Thus, the outputs S5 and S6 of the cell C1 for example are further applied through a third switching position to the inputs S3 and S4 respectively of the next cell 2. Which, according to preceding FIGS. 8A and 8B, allows the harmonic of rank 4 to be formed with these two cells. In so far as the next cells are concerned, the operation may be repeated by also including the preceding output as switching position for the lateral inputs, that is to say that the cell C3 will further have an additional position, that is to say four in all, for increasing the number of jump possibilities at the output, while decreasing the number of basic cells forming the synthesizer apparatus.

What is claimed is:

1. A frequency synthesis method comprising the steps of:

determining a basic frequency $F_r$;

first multiplying a first pair of in-quadrature jump signals of frequency $mF_r$, m being an integer equal to or greater than 1, by a second pair of in-quadrature jump signals of frequency $pF_r$, p being an integer equal to or greater than 1;

first adding a result of said first multiplying with a given positive or negative component, so as to obtain a third pair of in-quadrature jump signals whose frequency corresponds to a harmonic of rank "m+p" of said basic frequency $F_r$;

repeatedly executing said first multiplying and first adding operations if required by replacing the coefficient "m" to change the "m+p" obtained and by determining the coefficient "p" so as to obtain a desired frequency value $nF_r$ where a coefficient "n" depends on a jump value n desired for use, n being a whole number and chosen between a minimum value 1 and a predetermined maximum N, the desired frequency thus corresponding to said basic frequency $F_r$, or to one of its harmonics;

second multiplying two in-quadrature signals relative to a carrier frequency Fc, respectively, by said third pair of in-quadrature jump signals; and second adding results of said second multiplying so as to obtain a frequency signal $F_c$ which is adjusted by the desired frequency value by a positive or negative amount depending on the one assigned to the in-quadrature signals relative to this jump frequency.

2. The method as claimed in claim 1, wherein said first multiplying and first adding steps include providing the products of (cos m x. cos px) and (sin m x sin px), the difference giving cos (m+p)x; and the products $\pm$(cos mx.sin px) and $\pm$(sin mx. cos px), their sum giving $\pm$sin (m+p)x (with $x=2\pi F_r t$); and selectively replacing one of said cosine values, or both in said first multiplying and adding steps, by the value "1", and one of said sine values, or both, by the value "0" depending on the value "m+p" desired.

3. The method as claimed in claim 2, wherein different frequency jump values in the range 1 to N considered are obtained from a reduced number of signals including said values "0" and "1", a pair of in quadrature signals corresponding to said basic frequency $F_r$ and a pair of in quadrature signals corresponding to said carrier frequency Fc.

4. A frequency synthesizer apparatus including:

a circuit for generating two in-quadrature signals relative to a frequency jump, said circuit being formed of a plurality P of elementary cells connected in cascade, each of the cells having:

(a) a first summing circuit connected as a subtracter, (b) a first pair of balanced mixers connected by their outputs to said first summing circuit, (c) a second summing circuit connected as an adder, (d) a second pair of balanced mixers connected by their outputs to said second summing circuit, (e) a first pair of inputs for receiving two in-quadrature jump signals of frequency $mF_r$, "m" being an integer equal to or greater than 1, (f) a second pair of inputs for receiving two in-quadrature jump signals of frequency $pF_r$, "p" being an integer equal to or greater than 1, and (g) two output means for delivering, after multiplication and summing by said two mixers and summing circuits, two in-quadrature jump signals of frequency $(m+p)F_r$ with a desired positive or negative value, said outputs being connected to a first pair of inputs of a next cell and so on, the values "m", "p" of the harmonics of a basic frequency $F_r$ being chosen for each cell so as to obtain at the output of each of the P cells a harmonic value of rank "n" desired for the frequency jump, said two in-quadrature jump signals of frequency $(m+p)f_r$ having a frequency equal to "n" times a basic frequency $F_r$, n being an integer greater than or equal to 1, depending on a jump value $nF_r$ desired for use and which is chosen in a range of values between $F_r$ and a predetermined maximum value $NF_r$;

a terminal circuit having two balanced mixers for multiplying said two in-quadrature jump signals of frequency $(m+p)f_r$ respectively by two in-quadrature signals relative to a carrier frequency Fc; and a third summing circuit for adding outputs of the two balanced mixers and delivering a signal transposed in frequency by a value of the frequency jump $(F_c \pm nF_r)$ by a positive or negative amount depending on an amount presented by said jump signals of frequency $(m+p)f_r$.

5. The apparatus as claimed in claim 4, further including means for producing the in-quadrature signals relative to the carrier frequency $F_c$ and the basic frequency $F_r$ from a common clock, and for producing signals having a value of "1" and "0", and switching control signals, and switching circuits for switching desired signals to said second pair of inputs and to the first pair of inputs of the first cell, said desired signals being either the pair of signals "0" and "1," or the pair of in-quadrature signals of frequency $F_r$, said producing means including means for controlling said switching circuits as a function of the jump value "n" selected for use.

6. The apparatus as claimed in claim 5, wherein at least one of the cells of rank 2 or higher include associated switching circuits having at least one additional switching position connected to a corresponding output of a preceding cell.

7. The apparatus as claimed in claim 6, wherein said at least one additional switching position includes, for a cell of rank j greater than or equal to 2, (j−1) additional positions corresponding respectively to the connections to the outputs of the preceding cells of rank 1 to (j−1).

* * * * *